(12) United States Patent
Kawaguchi et al.

(10) Patent No.: US 10,373,793 B2
(45) Date of Patent: Aug. 6, 2019

(54) CONDUCTIVE CONTACT POINT PIN AND CHARGED PARTICLE BEAM APPARATUS

(71) Applicants: NUFLARE TECHNOLOGY, INC., Kanagawa (JP); KABUSHIKI KAISHA TOSHIBA, Tokyo (JP)

(72) Inventors: Michihiro Kawaguchi, Mishima (JP); Kiminobu Akeno, Yokohama (JP); Kenichi Kataoka, Tokyo (JP); Tomoki Umetsu, Tokyo (JP)

(73) Assignee: NUFLARE TECHNOLOGY, INC., Kanagawa (JP)

( * ) Notice: Subject to any disclaimer, the term of this patent is extended or adjusted under 35 U.S.C. 154(b) by 0 days.

(21) Appl. No.: 15/687,886

(22) Filed: Aug. 28, 2017

(65) Prior Publication Data
US 2018/0068824 A1 Mar. 8, 2018

(30) Foreign Application Priority Data

Sep. 5, 2016 (JP) .................................. 2016-173138
Jun. 29, 2017 (JP) .................................. 2017-127431

(51) Int. Cl.
*H01R 4/68* (2006.01)
*H01J 37/02* (2006.01)
*H01J 37/317* (2006.01)
*H01R 4/2406* (2018.01)
*H01R 4/66* (2006.01)

(52) U.S. Cl.
CPC ........ *H01J 37/026* (2013.01); *H01J 37/3174* (2013.01); *H01R 4/2406* (2018.01); *H01R 4/66* (2013.01)

(58) Field of Classification Search
None
See application file for complete search history.

(56) References Cited

U.S. PATENT DOCUMENTS

| 7,818,816 | B1 * | 10/2010 | Reppert | B82Y 10/00 |
| | | | | 250/306 |
| 9,316,670 | B2 * | 4/2016 | Kister | G01R 1/06716 |
| 2006/0228873 | A1 * | 10/2006 | Liu | G03F 7/0002 |
| | | | | 438/496 |

(Continued)

FOREIGN PATENT DOCUMENTS

| JP | 11121168 A * | 4/1999 | ......... H01L 27/3283 |
| JP | 11121168 A * | 4/1999 | ......... H01L 27/3283 |

(Continued)

OTHER PUBLICATIONS

Office Action from Taiwan Patent App. No. 10720462950 (dated May 23, 2018) with English language translation hereof.

(Continued)

*Primary Examiner* — Andrew Smyth
(74) *Attorney, Agent, or Firm* — Cermak Nakajima & McGowan LLP; Tomoko Nakajima

(57) ABSTRACT

A conductive contact point pin includes a pin body, and a plurality of convex portions formed in a tip portion of the pin body, wherein the conductive contact point pin breaks, by pressing a substrate where a film to be broken is formed on a conductive film from above the film to be broken, the film to be broken in order to be electrically connected to the conductive film.

17 Claims, 16 Drawing Sheets

(56) References Cited

U.S. PATENT DOCUMENTS

| | | | | |
|---|---|---|---|---|
| 2008/0054195 A1* | 3/2008 | Tachikawa | ............. | B82Y 10/00 |
| | | | | 250/492.22 |
| 2008/0257867 A1* | 10/2008 | Malshe | ............... | B81C 1/00492 |
| | | | | 219/69.14 |
| 2011/0031387 A1* | 2/2011 | Nakayamada | ......... | B82Y 10/00 |
| | | | | 250/252.1 |
| 2015/0206740 A1* | 7/2015 | Brandt | ................ | H01L 21/0277 |
| | | | | 250/453.11 |

FOREIGN PATENT DOCUMENTS

| | | | |
|---|---|---|---|
| JP | 2000-147004 A | | 5/2000 |
| JP | 2008-058809 A | | 3/2008 |
| JP | 2010-038803 A | | 2/2010 |
| JP | 2010038803 A | * | 2/2010 |
| JP | 2010-074059 A | | 4/2010 |
| JP | 2012-015331 A | | 1/2012 |
| JP | 2013-165283 A | | 8/2013 |
| JP | 2016-076651 A | | 10/2014 |

OTHER PUBLICATIONS

Office Action from Taiwan Patent App. No. 106128198 (dated Aug. 30, 2018) with English language translation thereof.

* cited by examiner

OK

L1 > L2

NG

CONDUCTIVE CONTACT POINT PIN AND CHARGED PARTICLE BEAM APPARATUS

CROSS-REFERENCE TO RELATED APPLICATION

This application is based upon and claims the benefit of priority from the prior Japanese Patent Application No. 2016-173138 filed on Sep. 5, 2016 in Japan and the prior Japanese Patent Application No. 2017-127431 filed on Jun. 29, 2017 in Japan, the entire contents of which are incorporated herein by reference.

BACKGROUND OF THE INVENTION

Field of the Invention

Embodiments of the present invention relate to an electrically conductive contact point pin and a charged particle beam apparatus, and, for example, relate to a contact point pin used as an earth pin which prevents charging (electrification) of a substrate when the substrate is irradiated with electron beams.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a high-precision master pattern.

An exposure mask substrate is fabricated by writing a circuit pattern with an electron beam onto a mask blank where a Cr film (light shielding film) and a resist film are, in order, formed on a quartz glass substrate, and performing development and etching of the light shielding film so as to form a light shielding film pattern (mask pattern). When a pattern is written by an electron beam writing apparatus, charging of the resist film occurs due to irradiation of the electron beam. Because of the charging of the resist film, the trajectory of the subsequent electron beam is bent, thereby becoming difficult to write a pattern with highly precise dimensions. Therefore, inhibiting charging of the resist film is performed by breaking (rupturing, fracturing) the resist film to insert an earth pin into the underlying conductive film, such as a Cr film, in order to execute earthing for inhibition of the charging (e.g., refer to Japanese Patent Application Laid-open No. 2012-015331).

With recent micropatterning, it is examined to form a dense insulating film layer on the light shielding film, which is different from the conventional way, in order to improve the etch resistance of the light shielding film when a mask pattern is formed. However, there is a problem in that since a dense insulating film has a high tensile strength, it is merely deformed and not broken even if the load to a conventional earth pin is increased, thereby being difficult for the pin to reach and enter the underlying conductive film. This causes difficulty in sufficiently inhibiting charging of the resist film because it is impossible to insert the earth pin into the conductive film to make it earthed. On the other hand, if the load is further increased, it may lead to a new problem of breaking the quartz glass substrate so as to generate particles. Such a problem is not limited to the mask substrate, but may similarly occur, for example, in the case of writing a pattern by directly irradiating a semiconductor substrate with an electron beam. Further, the problem of not reaching the underlying conductive layer because of not being able to break the insulating film may also occur, for example, in the case of measuring a resistance value of the conductive layer under the insulating film of the semiconductor substrate as well as in the case of earthing.

BRIEF SUMMARY OF THE INVENTION

According to one aspect of the present invention, a conductive contact point pin includes a pin body, and a plurality of convex portions formed in a tip portion of the pin body, wherein the conductive contact point pin breaks, by pressing a substrate where a film to be broken is formed on a conductive film from above the film to be broken, the film to be broken in order to be electrically connected to the conductive film.

According to another aspect of the present invention, a charged particle beam apparatus includes a stage configured to mount thereon a substrate where a film to be broken is formed on a conductive film, a conductive contact point pin configured to include a pin body and a plurality of convex portions formed in a tip portion of the pin body, and break the film to be broken by pressing from above the film to be broken in order to be electrically connected to the conductive film, and an irradiation mechanism configured to irradiate the substrate with a charged particle beam, in a state where a ground potential has been applied to the conductive contact point pin.

DETAILED DESCRIPTION OF THE INVENTION

Embodiments below describe a conductive contact point pin which can be in electrical conduction with an underlayer film by breaking (rupturing, fracturing) a dense film to be broken.

First Embodiment

Figure 1:
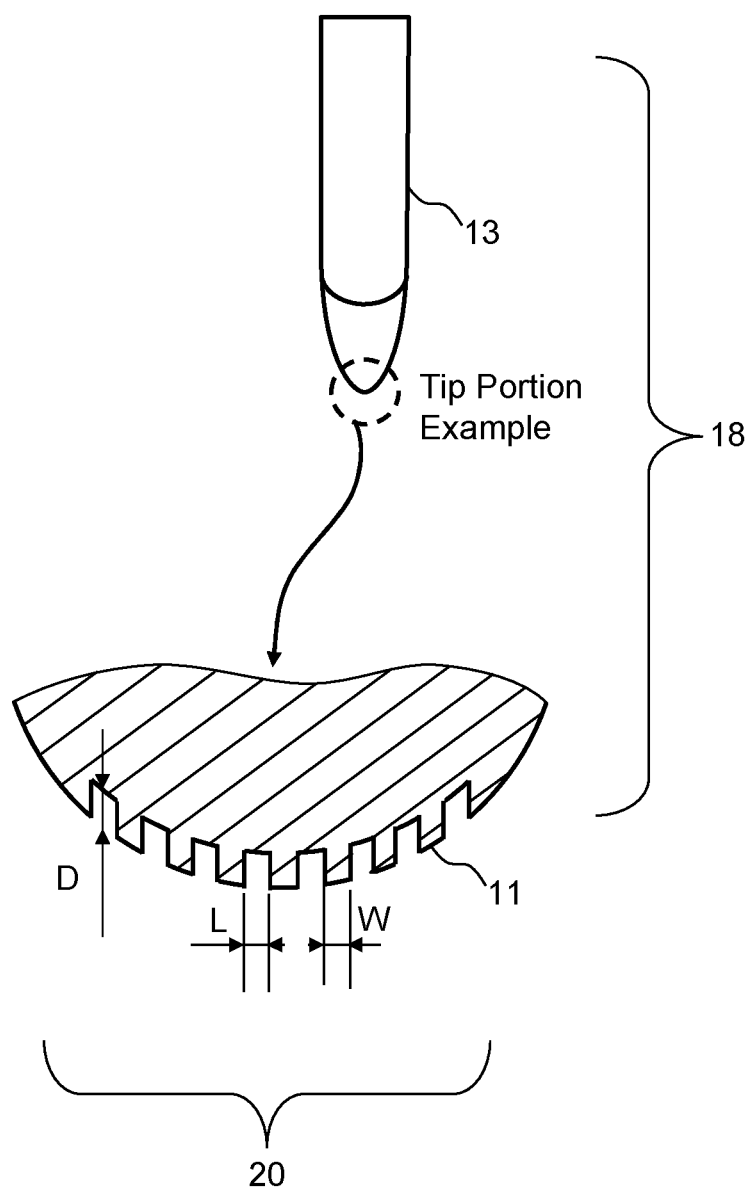
FIG. 1 shows a structure of an electrically conductive contact point pin according to a first embodiment.
Figure 2:
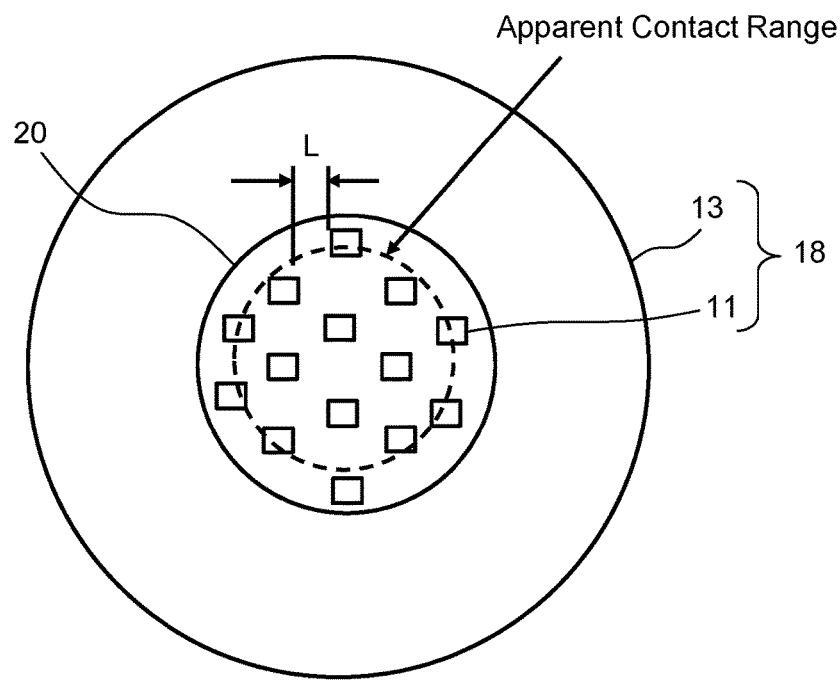
FIG. 2 shows a conductive contact point pin seen from the top side according to the first embodiment.

FIG. 1 shows a structure of an electrically conductive contact point pin according to a first embodiment. FIG. 2 shows a conductive contact point pin seen from the top side according to the first embodiment. In FIG. 1, a conductive contact point pin 18 according to the first embodiment includes a pin body 13 and a plurality of convex portions 11 formed at the tip portion of the pin body 13. As shown in FIGS. 1 and 2, the conductive contact point pin 18 includes the pin body 13 having a cylindrical shape, quadrangular prismatic shape, or the like, and the tip side (the lower side in FIG. 1) of the pin 18 has been tapered. The tip of the tapered portion has a round surface such as a spherical (SR) shape, for example. By having a tapered tip portion, it becomes easy to press that portion into a film. As shown in FIGS. 1 and 2, a region 20 at the tip portion formed in the shape of a sphere, for example, is engraved/carved from the tip side to form a plurality of convex portions 11 (in other words, a plurality of concave portions each formed between the convex portions 11) each having a quadrangular prismatic shape. Due to the formation structure of a plurality of convex portions 11 on the rounded surface at the tip portion, at least the convex portions 11 at the tip can certainly contact the conductive film. The region 20 is set to be a larger region than the apparent contact surface based on Holm's formula. Thereby, a plurality of convex portions 11 which form a real contact surface according to the Holm's formula are certainly arranged within the apparent contact surface.

The conductive contact point pin 18 is made from a conductive material. For example, it is preferable to use a ultra-hard conductive material such as conductive diamond or conductive zirconia. Although it has been described that the shape of the pin body 13 is cylindrical or quadrangular prismatic, it may also be a triangular prismatic shape, pentagonal prismatic shape, hexagonal prismatic shape, or other polygonal prismatic shape. The shape of the tapered tip portion may be a conical shape, triangular pyramid shape, quadrangular pyramid shape, pentagonal pyramid shape, hexagonal pyramid shape, or other polygonal pyramid shape. Moreover, although it has been described that the shape of the convex portion 11 is quadrangular prismatic, it may also be a cylindrical shape, triangular prismatic shape, pentagonal prismatic shape, hexagonal prismatic shape, or other polygonal prismatic shape. More preferably, it is a cylindrical shape or a polygonal prismatic shape with four or more corners.

Regarding the size of the pin body 13, its sectional diameter or sectional one side is preferably about 0.1 mm to 0.5 mm. Desirably, it should be from 0.2 mm to 0.4 mm. Furthermore, desirably, it should be from 0.2 mm to 0.3 mm. The longitudinal length is preferably from about 1 mm to 5 mm. Desirably, it should be from 1 mm to 3 mm. Furthermore, desirably, it should be from 1 mm to 1.5 mm. Regarding the spherical tip portion, the SR (spherical radius) is preferably from 10 µm to 40 µm. Desirably, SR should be from 15 µm to 30 µm. Furthermore, desirably, it should be from 15 µm to 25 µm. Although the width W of the convex portion 11 and the interspace L between the convex portions 11 are about the same size in FIG. 1, practically the interspace L is formed to be longer than the width W of the convex portion 11 as to be described later.

Figure 3:
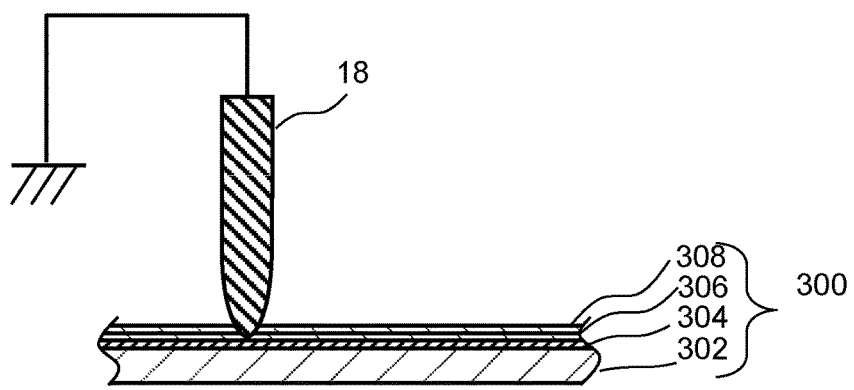
FIG. 3 is a sectional view showing an example of a conductive state of a conductive contact point pin according to the first embodiment.

FIG. 3 is a sectional view showing an example of a conductive state of a conductive contact point pin according to the first embodiment. FIG. 3 shows, as an example, a sectional view of an exposure mask substrate used for manufacturing semiconductor devices. There is shown an exposure mask substrate 300 (mask blank before written) to be irradiated with an electron beam, where a conductive film 304 is formed on a glass substrate 302, an insulating film 306 is formed on the conductive film 304, and a resist film 308 is formed on the insulating film 306. As a material of the conductive film 304, it is preferable to use, for example, chromium (Cr), tungsten (W), chromium nitride (CrNx), etc. After performing writing on the resist film 308, the insulating film 306 remains, through developing and etching, to serve as a light shielding film, thereby forming a mask pattern of the insulating film 306. As described above, with the recent micropatterning, the dense insulating film 306 is formed on the conductive film 304, which is different from the conventional way, in order to improve the etch resistance of the conductive film 304 (light shielding film) when a mask pattern is formed. As a material of the dense insulating film 306, it is preferable to use, for example, chromic oxide ($CrO_2$), silicon nitride (SiNx), silicon oxide (SiOx), or the like. The dense insulating film 306 has a high tensile strength. Therefore, it has been difficult for a conventional earth pin to break the dense insulating film 306 even though it can break/fracture the resist film. Even if the load to the earth pin is increased, the dense insulating film 306 is merely deformed and not broken, thereby being difficult for the pin to reach and enter the underlying conductive film 304. This causes difficulty in sufficiently inhibiting charging of the resist film 308 because it is impossible to insert the earth pin into the conductive film 304 to make it earthed. On the other hand, according to the first embodiment, since a plurality of convex portions 11 are formed at the tapered tip portion of the pin body 13, it is possible to break the films to be broken in order to be electrically connected to the conductive film 304, by pressing the exposure mask substrate 300 (mask blank before written) (an example of substrate) where the dense insulating film 306 and the resist film 308, being films to be broken, are formed on the conductive film 304 from above the film to be broken. Here, the laminated film of the dense insulating film 306 and the resist film 308 serves as a film to be broken for electrical conduction with the conductive film 304. In FIG. 3, a plurality of convex portions 11 at the tip portion of the conductive contact point pin 18 are not shown. Next, specifications, such as shape and size, of a plurality of convex portions 11 at the tip portion of the conductive contact point pin 18 will be described.

Figure 4A:
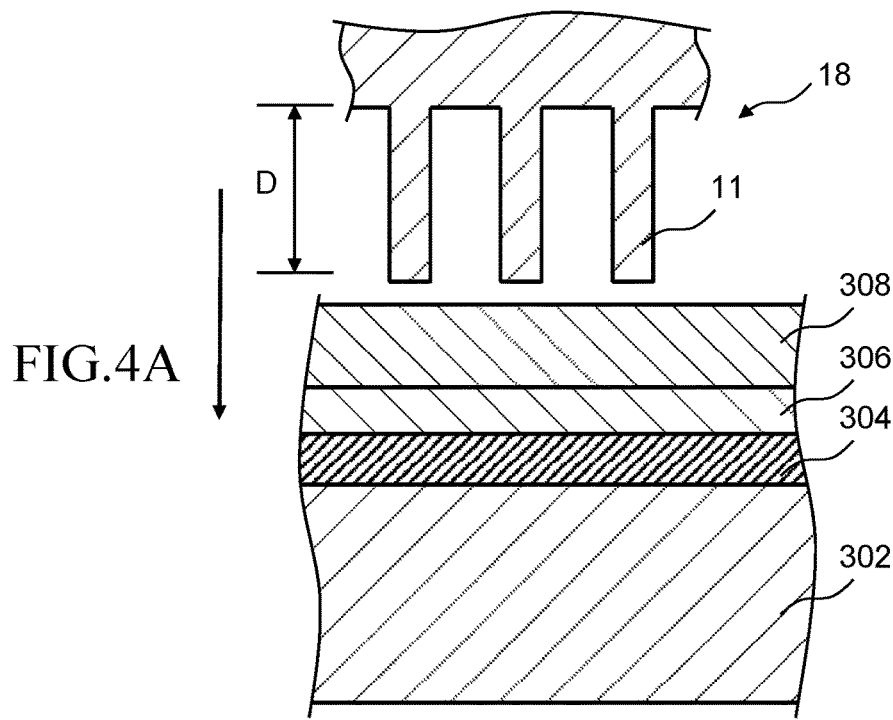
FIGS. 4A and 4B are sectional views showing examples of the state before and after insertion of the tip portion of the conductive contact point pin according to the first embodiment.
Figure 4B:
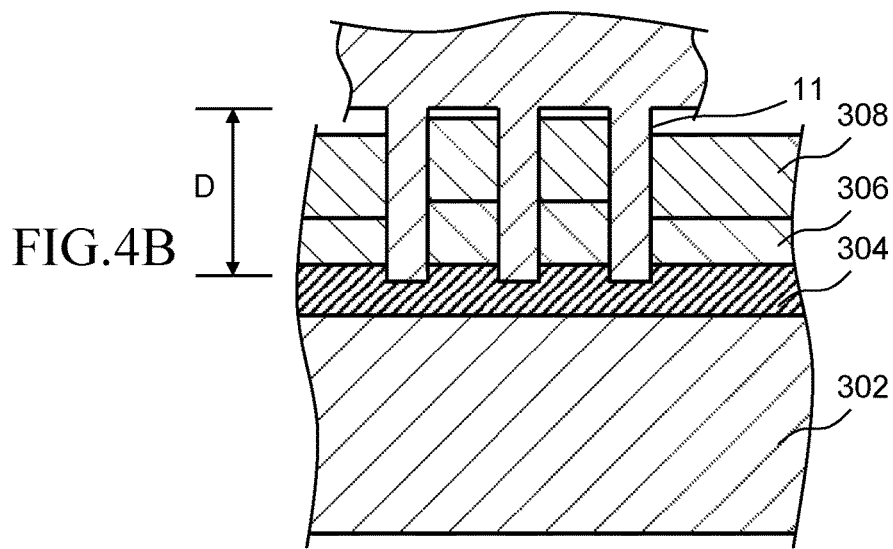

FIGS. 4A and 4B are sectional views showing examples of the state before and after insertion of the tip portion of the conductive contact point pin according to the first embodiment. FIG. 4A shows a state before inserting a plurality of convex portions 11 at the tip portion of the conductive contact point pin 18 into the exposure mask substrate 300 (mask blank before written) being the same as that in FIG. 3. In the exposure mask substrate 300 (mask blank before written), the conductive film 304 is formed to be 10 to 30 nm thick, for example. The insulating film 306 is formed to be 20 to 40 nm thick, for example. The resist film 308 is formed to be 80 to 200 nm thick, for example. When pressing the conductive contact point pin 18 against the exposure mask substrate 300 (mask blank before written) in order to insert a plurality of convex portions 11 from above the resist film 308, the plurality of convex portions 11 break the resist film 308 and, further, the underlying insulating film 306 as shown in FIG. 4B. Then, the plurality of convex portions 11 reach the further underlying conductive film 304. In such a case, broken resist film 308 and broken insulating film 306 are embedded (buried) in the interspace between adjacent convex portions 11. Therefore, the height dimension D of a plurality of convex portions 11 is formed to be longer than the total thickness of the resist film 308 and the insulating film 306, which is the thickness of the films to be broken. For example, if the total film thickness of the resist film 308 and the insulating film 306 is 200 nm (0.2 µm), the height dimension D of a plurality of convex portions 11 is formed to be longer than 0.2 µm. As shown in FIG. 4B, the film portion, which was pushed aside due to the insertion of the convex portion 11, is also embedded (buried) in the interspace between the adjacent convex portions 11. Therefore, what is effective is that the height dimension D of a plurality of convex portions 11 can hold a space to incorporate the film portion having been pushed aside. Accordingly, the height dimension D is preferably a little longer than the total film thickness of the resist film 308 and the insulating film 306. More preferably, for example, the height dimension D is equal to or longer than 1.5 times the total film thickness of the resist film 308 and the insulating film 306. For example, if the total film thickness of the resist film 308 and the insulating film 306 is 200 nm (0.2 µm), the height dimension D of a plurality of convex portions 11 needs to be equal to or longer than 0.2 µm, and more preferably to be equal to or longer than 0.3 µm. For example, it has been confirmed by experiment that the height dimension D of 0.3 µm is enough to acquire a sufficient electrical conduction effect (resistance value) when a material of the resist film 308 whose Poisson's ratio is 0.3 to 0.4 is used and the total film thickness of the resist film 308 and the insulating film 306 is 200 nm (0.2 µm). A necessary height dimension D of the convex portion 11 can be obtained by an equation: height dimension D=(resist film thickness+insulating film thickness)+(resist film thickness×Poisson's ratio).

Figure 5:
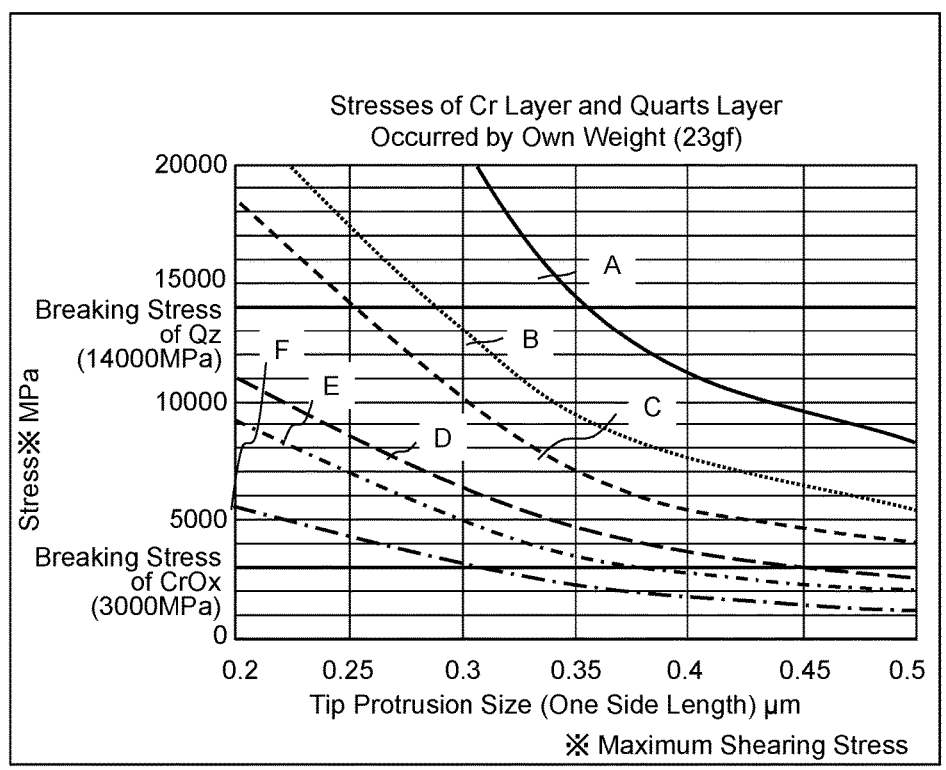
FIG. 5 shows an example of a relation among the size, number, and stress of a convex portion according to the first embodiment.

FIG. 5 shows an example of a relation among the size, number, and stress of a convex portion according to the first embodiment. In FIG. 5, the ordinate axis represents a stress occurring in each layer, and the abscissa axis represents the size of a convex portion. In the case shown here, the load of 0.225 N (23 gf), for example, presses the conductive contact point pin 18. FIG. 5 shows distributions of stresses applied to $CrO_2$ (insulating film 306) in the cases of there being twenty-five (B), fifty (D), and one hundred convex portions 11 (F), and distributions of stresses applied to quartz (Qz: glass substrate 302) in the cases of there being twenty-five (A), fifty (C), and one hundred convex portions 11 (E). The number of the convex portions 11 herein indicates the ones pressing the insulating film 306 and quartz.

In the first embodiment, for making the conductive contact point pin 18 be in electrical conduction with the conductive film 304, it is necessary to break $CrO_2$ (insulating film 306). Accordingly, the size and number of the convex portions 11 need to be sufficient such that the stress at the tip portion of the convex portion 11 is larger than the breaking (rupture, fracture) stress (about 3000 MPa in FIG. 5) of $CrO_2$. On the other hand, it is not preferable for the conductive contact point pin 18 to break the glass substrate 302 because particles will occur if the substrate is broken. Therefore, the size and number of the convex portions 11 need to be such that the stress at the tip portion of the convex portion 11 is smaller than the breaking stress (about 14000 MPa in FIG. 5) of quartz. Thus, the range of the size and number of the convex portions 11 to be used is determined depending on the material of the target substrate. When breaking the insulating film 306 by a plurality of convex portions 11, the film is broken, not by all of the top surface (tip top surface) of the convex portion 11, but by stress concentration which occurs at the peripheral sides (e.g., straight lines) forming the top surface (tip top surface) of the convex portion 11. In other words, the shearing stress can be approximated by the equation: shearing stress=load/([total length of peripheral sides (e.g., straight lines) of top surface of the convex portion 11]×[the number of the convex portions 11]). Therefore, the stress distribution shown in FIG. 5 is represented by values of concentrated stress which occurs at the peripheral sides (e.g., straight lines) of the rectangular top surface (tip top surface). Since a conventional earth pin without a plurality of convex portions does not have sufficient sides or has no sides where a concentrated stress occurs, a concentrated stress enough to break the insulating film 306 does not occur at the tip portion of the earth pin even if the load to press the earth pin is increased. Consequently, the insulating film 306 is only deformed and not broken. On the other hand, according to the first embodiment, it is possible, by using a plurality of convex portions 11, to generate a concentrated stress enough to break the insulating film 306. As a result, the conductive contact point pin 18 can break the insulating film 306 so as to reach the underlying conductive film 304.

Figure 6:
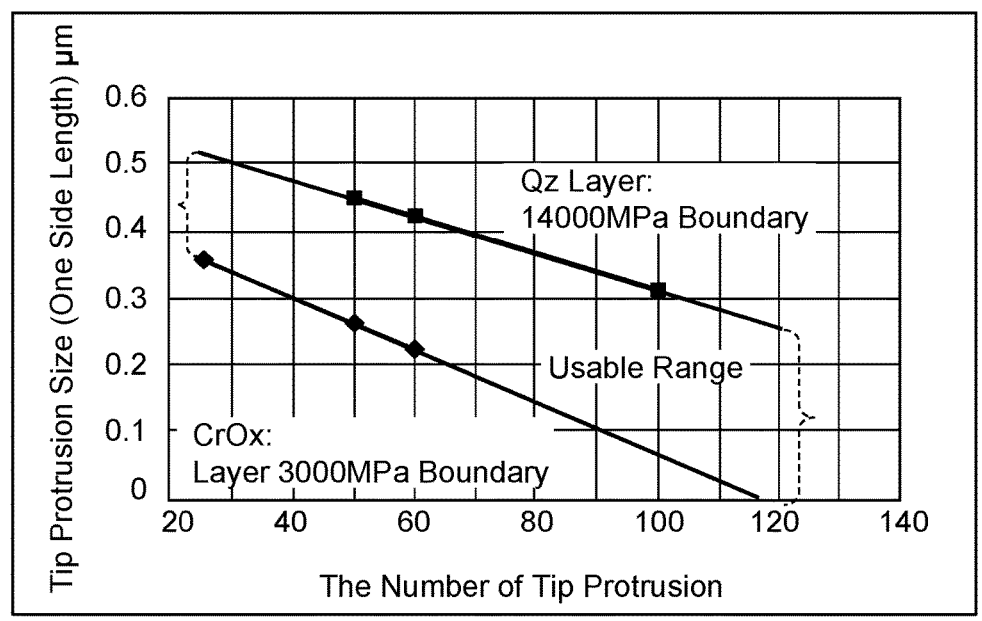
FIG. 6 shows an example of a relation between the size and the number of the convex portions to be used according to the first embodiment.

FIG. 6 shows an example of a relation between the size and the number of the convex portions to be used according to the first embodiment. In FIG. 6, the ordinate axis represents the size (one side of a square) of the peripheral sides (e.g., straight lines) forming the top surface (tip top surface) of the convex portion 11, and the abscissa axis represents the number of the convex portions 11 contacting a film. FIG. 6 shows the range which is usable according to the description of FIG. 5, and, therefore, the size and number in the region between two lines of the boundary of the breaking stress of $CrO_2$ and the boundary of the breaking stress of quartz indicate a usable region of the convex portion. For example, in the case of setting the number of the convex portions 11 contacting the film to forty, the size (one side of a square) of the peripheral sides (e.g., straight lines) forming the top surface (tip top surface) of the convex portion 11 can be 0.3 µm to 0.47 µm. For example, in the case of setting the number of the convex portions 11 contacting the film to sixty, the size (one side of a square) of the peripheral sides (e.g., straight lines) forming the top surface (tip top surface) of the convex portion 11 can be 0.22 µm to 0.42 µm. From a reverse viewpoint, in the case of setting the size (one side of a square) of the peripheral sides (e.g., straight lines) forming the top surface (tip top surface) of the convex portion 11 to 0.3 µm, the number of the convex portions 11 contacting the film can be within the range from forty to one-hundred and five. When fabricating a plurality of convex portions 11, it is actually preferable that the size (one side of a square) of the peripheral sides (e.g., straight lines) forming the top surface (tip top surface) of the convex portion 11 is 0.05 µm or more. More preferably, the size should be 0.2 µm to 0.5 µm. Furthermore preferably, the size should be 0.3 µm to 0.4 µm. The number of the convex portions 11 contacting the film is preferably twenty-five or more. More preferably, the number should be thirty to sixty-five. When fabricating the conductive contact point pin 18, it is actually sufficient to form the convex portions 11 whose number, including the number of the convex portions 11 not contacting the insulating film 306, is greater than the number of contacting determined based on the condition range described above. Thereby, it becomes possible to secure the number of the convex portions 11 required for breaking the insulating film 306.

Figure 7A:
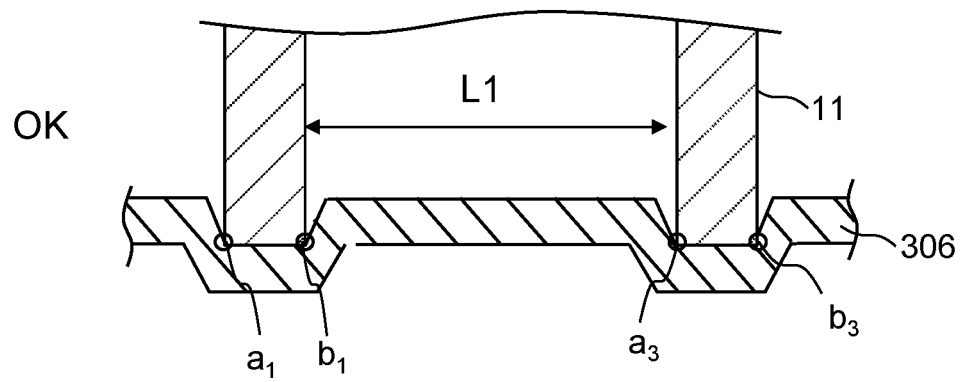
FIGS. 7A and 7B show examples of a relation between the state of an insulating film pressed by a convex portion and the size of an interspace between adjacent convex portions according to the first embodiment.
Figure 7B:
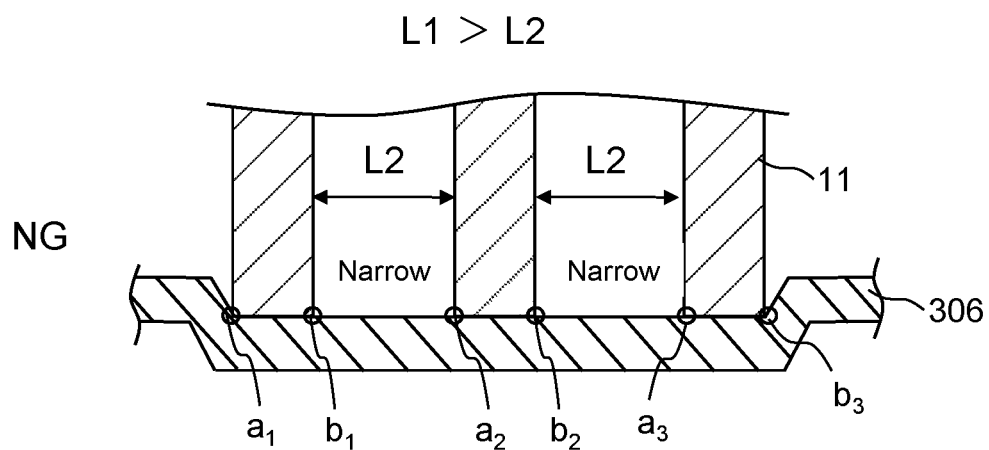

FIGS. 7A and 7B show examples of a relation between the state of an insulating film pressed by a convex portion and the size of an interspace between adjacent convex portions according to the first embodiment. FIG. 7A shows a state of a section of the insulating film 306 pressed by a plurality of adjacent convex portions 11 in the case where a size (distance) L1 of the interspace between the adjacent convex portions 11 is formed in a sufficient size. FIG. 7B shows a state of a section of the insulating film 306 pressed by a plurality of adjacent convex portions 11 in the case where a size (distance) L2 of the interspace between the adjacent convex portions 11 is narrower than the sufficient size. That is, L1>L2. When the convex portion 11 applies pressure to the insulating film 306, the insulating film 306 is actually broken by the action of the peripheral sides (e.g., straight lines) forming the top surface (tip top surface) of the convex portion 11. Therefore, it is necessary to generate a concentrated stress at the peripheral sides (e.g., straight lines). For example, when the size (distance) L of the interspace between the adjacent convex portions 11 is narrow as shown in FIG. 7B, concentrated stress occurs at the side $a_1$ on the left side of the convex portion 11 located at the left end, and at the side $b_3$ on the right side of the convex portion 11 located at the right end. Consequently, the two sides $a_1$ and $b_3$ can at least deform (distort) the insulating film 306. However, the insulating film 306 deformed by the two sides $a_1$ and $b_3$ still maintains a flat state between the two sides $a_1$ and $b_3$. In other words, the insulating film 306 is not deformed by the central convex portion 11. That is, concentrated stress has not occurred at the sides $a_2$ and $b_2$ of the central convex portion 11. Similarly, the insulating film 306 is not deformed at the side $b_1$ on the right side of the convex portion 11 located at the left end, and at the side $a_3$ on the left side of the convex portion 11 located at the right end. In other words, concentrated stress has not occurred at the sides $b_1$ and $a_3$. Therefore, even if the load is increased in this state, it is difficult for the sides $b_1$, $a_2$, $b_2$, and $a_3$ to break the insulating film 306. Consequently, at least the central convex portion 11 cannot contact the underlying conductive film 304. Thus, the number of the convex portions 11 configuring a real contact surface is insufficient, and therefore, a contact resistance value needed for prevention of charging cannot be acquired. On the other hand, as shown in FIG. 7A, when the size (distance) L1 of the interspace between the adjacent convex portions 11 is sufficiently secured, all the sides of the adjacent convex portions 11 in contact with the insulating film 306 can at least deform (distort) the insulating film 306. That is, concentrated stress can be generated at all the sides $a_1$, $b_1$, $a_3$, and $b_3$ of the adjacent convex portions 11. Then, if the stress of each side exceeds the shearing stress (tensile stress) of the insulating film 306, it becomes possible to break the insulating film 306. As a result, the adjacent convex portions 11 can contact the underlying conductive film 304. Therefore, the number of the convex portions 11 for forming the real contact surface can be secured, and a contact resistance value needed for prevention of charging can be acquired. Therefore, what is necessary is to form a plurality of convex portions 11 with having the size (distance) L1 of the interspace between adjacent convex portions 11 so that each of the sides $a_1$, $b_1$, $a_3$, and $b_3$ of the adjacent convex portions 11 can obtain a stress exceeding the shearing stress (tensile stress) of the insulating film 306.

Figure 8:
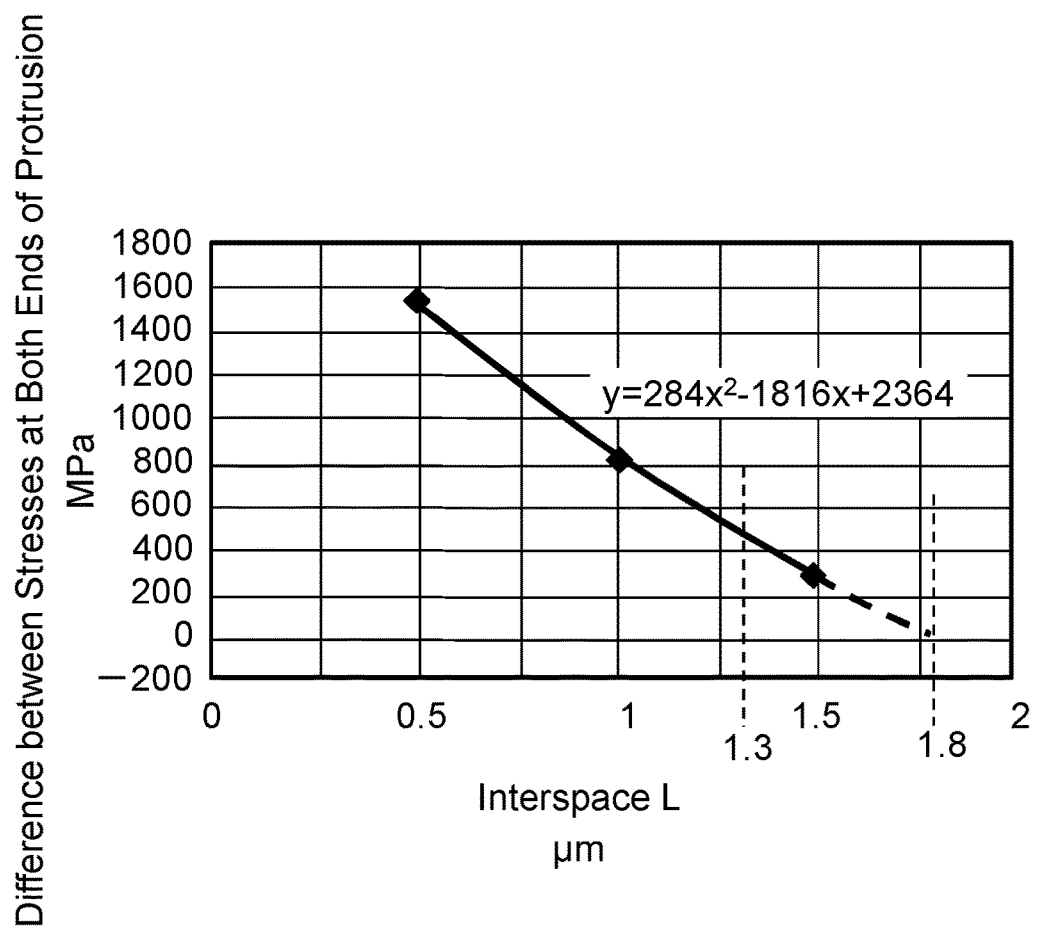
FIG. 8 shows a relation between a stress difference of stresses applied to the both end sides of the convex portion, and the size of an interspace of the adjacent convex portions according to the first embodiment.

FIG. 8 shows a relation between a stress difference of stresses applied to the both end sides of the convex portion, and the size of an interspace of the adjacent convex portions according to the first embodiment. In order for both the adjacent convex portions 11 to certainly break the insulating film 306, it is most preferable that stress for deforming (distorting) the insulating film 306 occurs at the both end sides (for example, sides $a_1$ and $b_1$ in FIG. 7A) of each convex portion 11, and a stress difference between stresses occurring at the both end sides (for example, sides $a_1$ and $b_1$ in FIG. 7A) is 0 (zero). In the example of FIG. 8, it turns out that the size (distance) L of the interspace between the adjacent convex portions 11 needs to be 1.8 µm for making the stress difference 0 (zero). However, it has turned out that, as a result of an experiment, if the size (distance) L of the interspace between the adjacent convex portions 11 is 1.3 µm or more, both the adjacent convex portions 11 can break the insulating film 306 even if the stress difference is not 0.

Figure 9A:
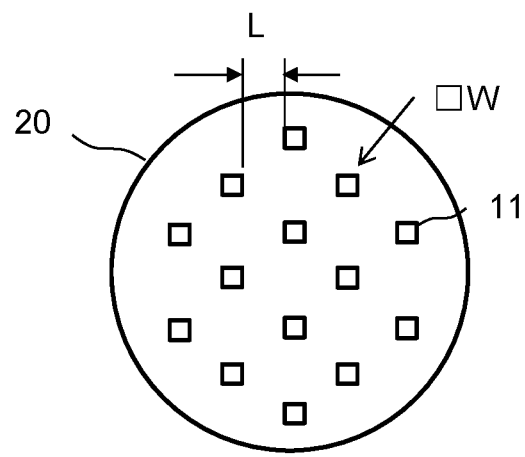
FIGS. 9A and 9B show examples of arrangement of convex portions according to the first embodiment.
Figure 9B:
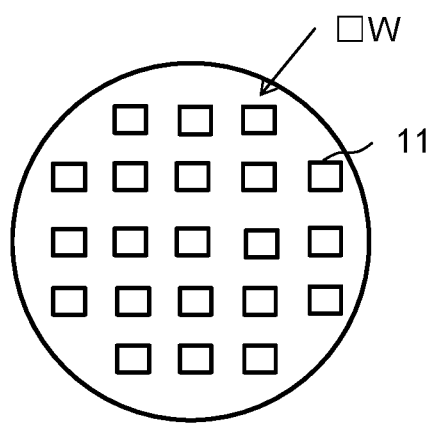

FIGS. 9A and 9B show examples of arrangement of convex portions according to the first embodiment. FIG. 9B shows the case where a plurality of convex portions 11 are formed at the tip of the tapered portion of the pin body 13 to be in the shape of a lattice with a ratio of, for example, 1:1 between the convex portion 11 and the interspace. In such a case, contamination has adhered between the convex portions 11 after the electrical connection has been performed. On the other hand, FIG. 9A shows the case where a plurality of convex portions 11 are formed at the tip of the tapered portion of the pin body 13 to be in the shape of a weaving lattice such that the interspace L between the convex portions 11 is sufficiently larger than the size W of the convex portion 11, for example. In such a case, no contamination has adhered after the electrical connection has been performed. From this result, it has turned out that if the interspace size L between the adjacent convex portions 11 is too narrow, not only the problem of difficulty in breaking the insulating film 306, but also a problem of adhesion of contamination generated by breaking the resist film 308 occurs. Therefore, even in the case of fabricating a plurality of convex portions by means of a rough surface finish, etc. which leads the interspace size L between the adjacent convex portions 11 to be about the same as the width W of the convex portion, a problem similar to the above occurs because the interspace becomes narrow. Also from this point of view, it turns out that it is effective to maintain the interspace L between the convex portions 11 at a predetermined length or more.

Figure 10:
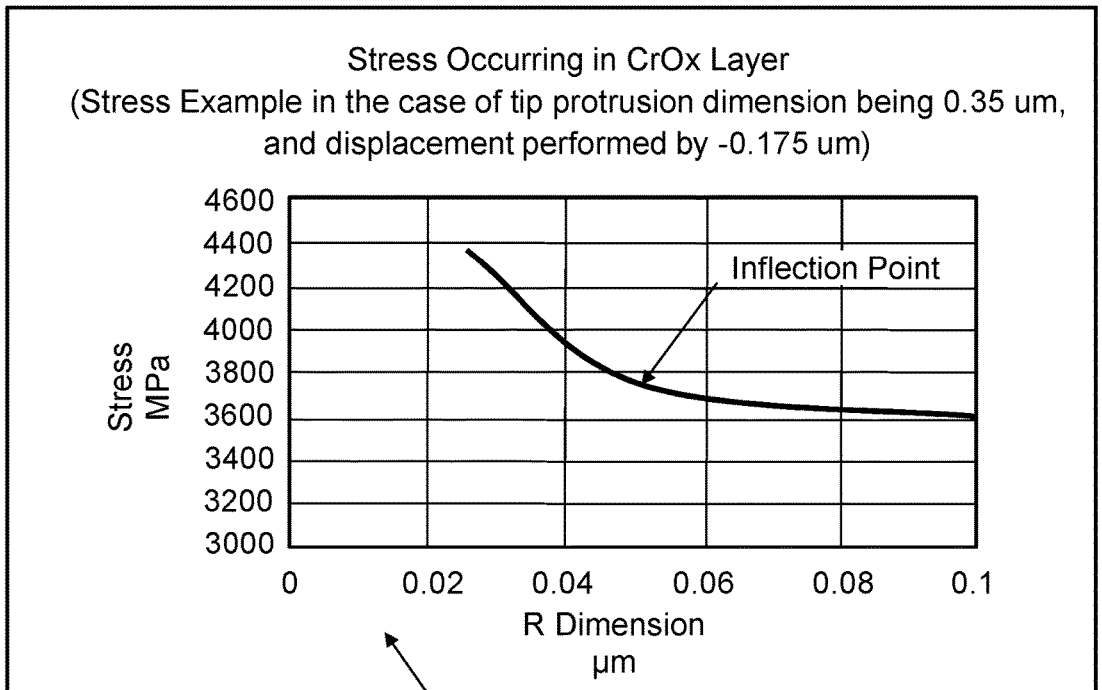
FIG. 10 illustrates influence on stress given by chamfering at the edge portion of the tip surface of the convex portion according to the first embodiment.
Figure 10:
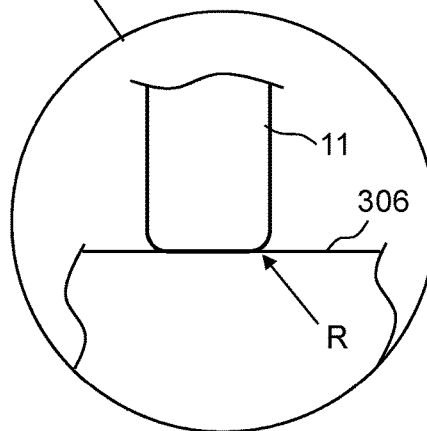

FIG. 10 illustrates influence on stress given by chamfering at the edge portion of the tip surface of the convex portion according to the first embodiment. FIG. 10 shows, as an example of stress to the insulating film 306 (CrOx) layer, the case of setting the size (one side of a square) of each of the peripheral sides (e.g., straight lines) forming the top surface (tip top surface) of the convex portion 11 to 0.35 μm, and displacement having been performed by −0.175 μm. In chamfering the tip surface of the convex portion 11, the generated stress decreases in proportion as the radial dimension (R dimension) is increased from r=0.025 μm, it reaches an inflection point at around r=0.05 μm, and then, the generated stress converges as the radial dimension (R dimension) increases. Therefore, it is preferable for the edge portion of the tip surface of the convex portion 11 to be as acute (sharp) an angle as possible, and, more preferably, to be smaller than the inflection point (r=0.05 μm).

Figure 11A:
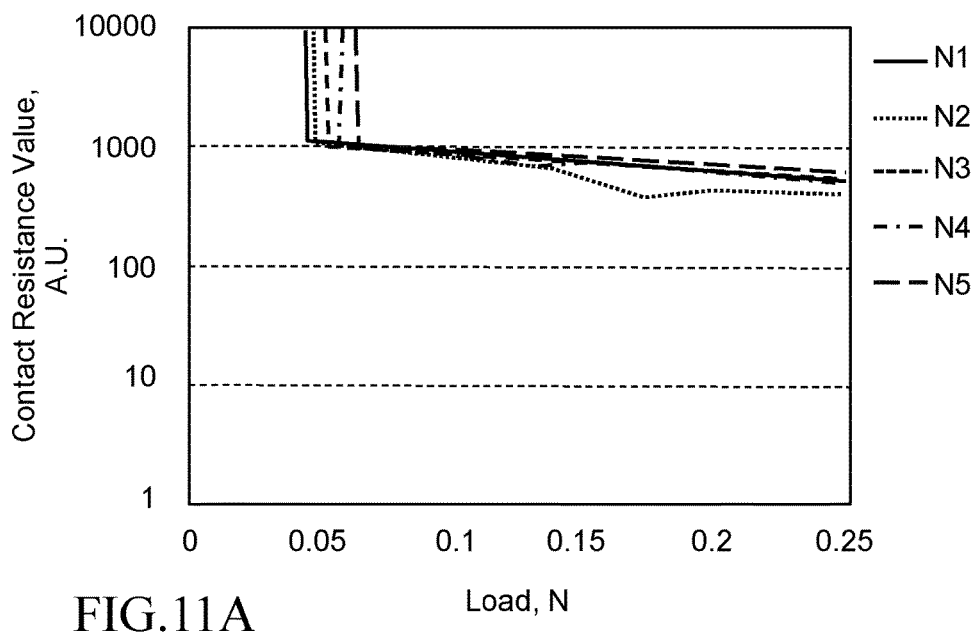
FIGS. 11A and 11B show examples of contact resistance values in the case of pressing a film to be broken with a conductive contact point pin according to the first embodiment and with a conventional pin according to a comparative example.
Figure 11B:
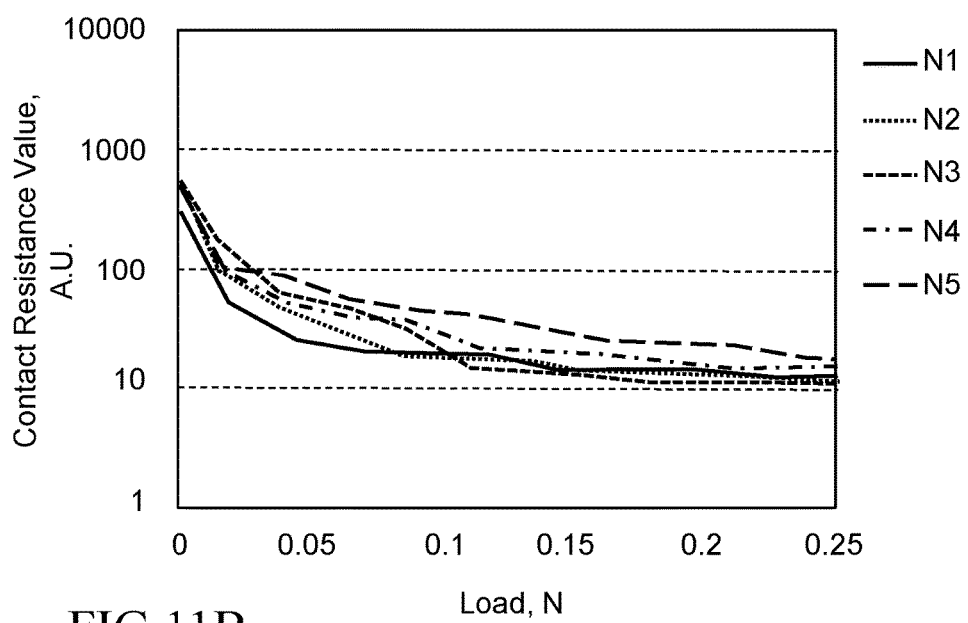

FIGS. 11A and 11B show examples of contact resistance values in the case of pressing a film to be broken with a conductive contact point pin according to the first embodiment and with a conventional pin according to a comparative example. FIG. 11A shows an example of a relation between load and contact resistance of a substrate surface in the case of pressing a film to be broken (laminated film of the insulating film 306 and the resist film 308) of the substrate with a conventional earth pin (comparative example) which does not have a plurality of convex portions 11 at the tip portion. The unit of contact resistance value is address unit (A.U.). FIG. 11B shows an example of a relation between load and contact resistance of a substrate surface in the case of pressing a film to be broken (laminated film of the insulating film 306 and the resist film 308) of the substrate with a conductive contact point pin (earth pin) which has a plurality of convex portions 11 at the tip portion according to the first embodiment. The unit of contact resistance value is address unit (A.U.). Using five samples N1 to N5, measurement is performed in the first embodiment and the comparative example. Here are shown results of measurement in the range of the load not to break quartz (glass substrate 302) in order not to generate particles. As shown in FIG. 11A, it turns out that, using the conventional earth pin without a plurality of convex portions 11, the contact resistance value hardly changes even if the load is increased. This means that the earth pin has not contacted the conductive film 304 lying under the insulating film 306. On the other hand, as shown in FIG. 11B, according to the first embodiment, it turns out that if the load is applied, the contact resistance value greatly decreases. In the example of FIG. 11B, the contact resistance value converges in any sample when the load is equal to or greater than 0.2 N. It turns out that the earth pin of the first embodiment has sufficiently contacted the conductive film 304 lying under the insulating film 306 when the load is equal to or greater than 0.2 N in any of the samples N1 to N5. That is, this means that the dense insulating film 306 has been broken which is particularly hard to break compared to other films to be broken. Thus, the shape of the first embodiment is effective for breaking the insulating film 306 with a load in the range not to break quartz (glass substrate 302).

Figure 12:
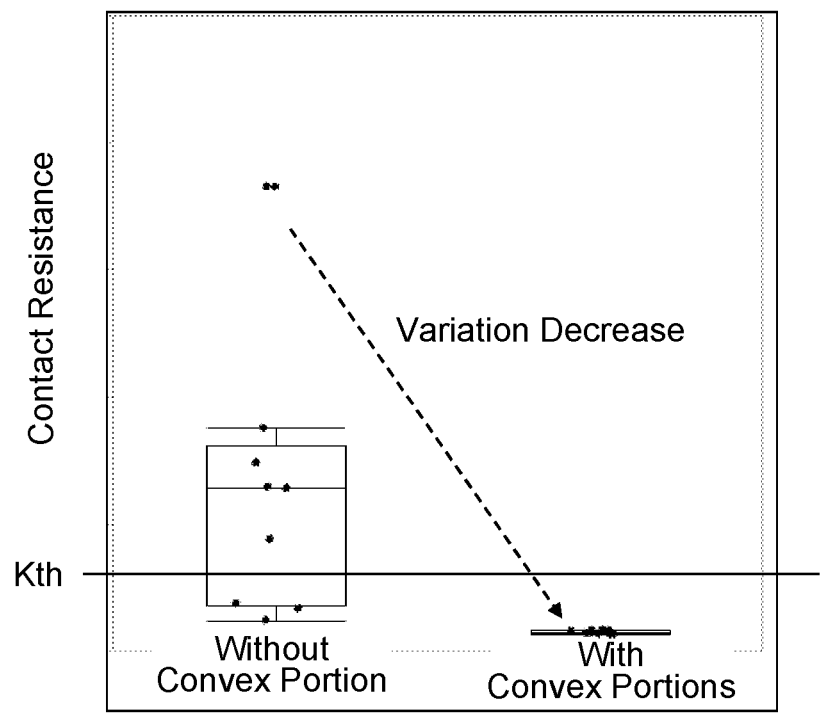
FIG. 12 shows another example of a contact resistance value in the case of pressing the film to be broken with a conductive contact point pin according to the first embodiment and with a conventional pin according to a comparative example.

FIG. 12 shows another example of a contact resistance value in the case of pressing the film to be broken with a conductive contact point pin according to the first embodiment and with a conventional pin according to a comparative example. FIG. 12 shows an example of a measurement result of contact resistance of the substrate surface obtained by a load applied regardless of being able to break quartz (glass substrate 302). FIG. 12 shows examples of measurement results of contact resistance of the substrate surface in the case of pressing the film to be broken (laminated film of the insulating film 306 and the resist film 308) of a substrate by using a conventional earth pin (comparative example) which does not have a plurality of convex portions 11 at the tip portion, and in the case of pressing the film to be broken (laminated film of the insulating film 306 and the resist film 308) of the substrate by using a conductive contact point pin (earth pin) of the first embodiment which has a plurality of convex portions 11 at the tip portion. Here, a plurality of samples have been formed for each of the earth pin of the comparative example and the earth pin of the first embodiment in order to measure their effects. With respect to the conventional earth pin (comparative example) which does not have a plurality of convex portions 11 at the tip portion, contact resistance values are various in a state such that there are a plenty of contact resistance values higher than an allowable threshold Kth of contact resistance value even if the load is increased, although there exist some samples in which the contact resistance value becomes low because the insulating film 306 was broken under some influence by a large load so as to make the earth pin reach the underlying layer. On the other hand, with respect to the first embodiment in which a plurality of convex portions 11 are arranged at the tip portion, variation of the contact resistance value is small because the contact resistance value in any sample is lower than the allowable threshold value Kth. This means that, in any sample, the earth pin of the first embodiment has sufficiently contacted the conductive film 304 lying under the insulating film 306.

Figures 13A, 13B:
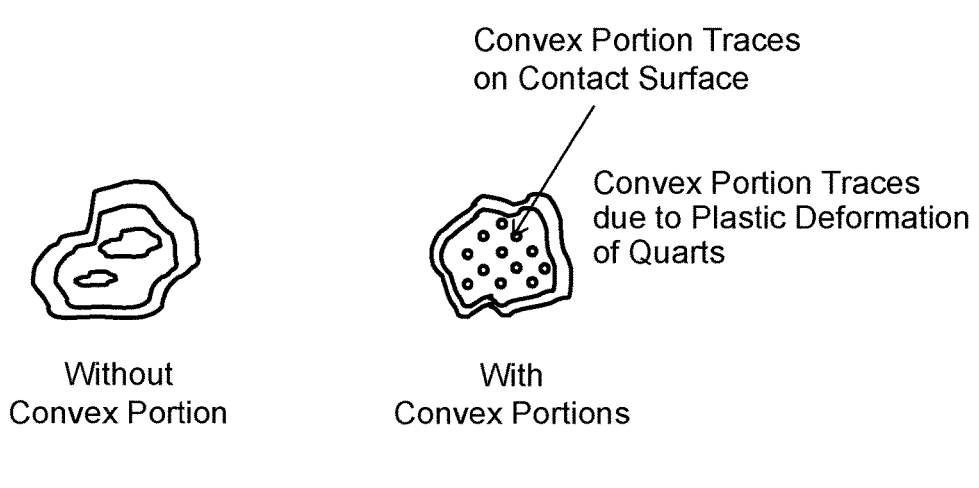
FIGS. 13A and 13B are for explaining examples of contact traces according to the first embodiment and a comparative example.

FIGS. 13A and 13B are for explaining examples of contact traces according to the first embodiment and a comparative example. FIG. 13A shows an example of a contact trace in the case of pressing a substrate with a load in the range not to break quartz (glass substrate 302) by using a conventional earth pin (comparative example) without a plurality of convex portions 11 at the tip portion. FIG. 13B shows an example of a contact trace in the case of pressing a substrate with a load in the range not to break quartz (glass substrate 302) by using an earth pin of the first embodiment with a plurality of convex portions 11 at the tip portion. In the comparative example, as shown in FIG. 13A, the earth pin has not reached the conductive film 304 while only having deformed the surface film of the substrate. On the other hand, in the experiment using the first embodiment, as shown in FIG. 13B, it has been confirmed that the convex portion of the earth pin deforms up to the quartz (glass substrate 302) and traces of the convex portions 11 are generated. Thus, according to the first embodiment, it is possible to make the earth pin reach the conductive film 304.

Hereafter will be described an example of an apparatus in which there is provided a conductive contact point pin (earth pin) of the first embodiment that can excellently break a film to be broken and can be excellently connected to the conductive film 304 as described above. In the first embodiment, a configuration in which an electron beam is used as an example of a charged particle beam is described. The charged particle beam is not limited to an electron beam, and other charged particle beam such as an ion beam may also be used. Moreover, a writing apparatus of a variable shaped beam type will be described as an example of a charged particle beam apparatus.

Figure 14:
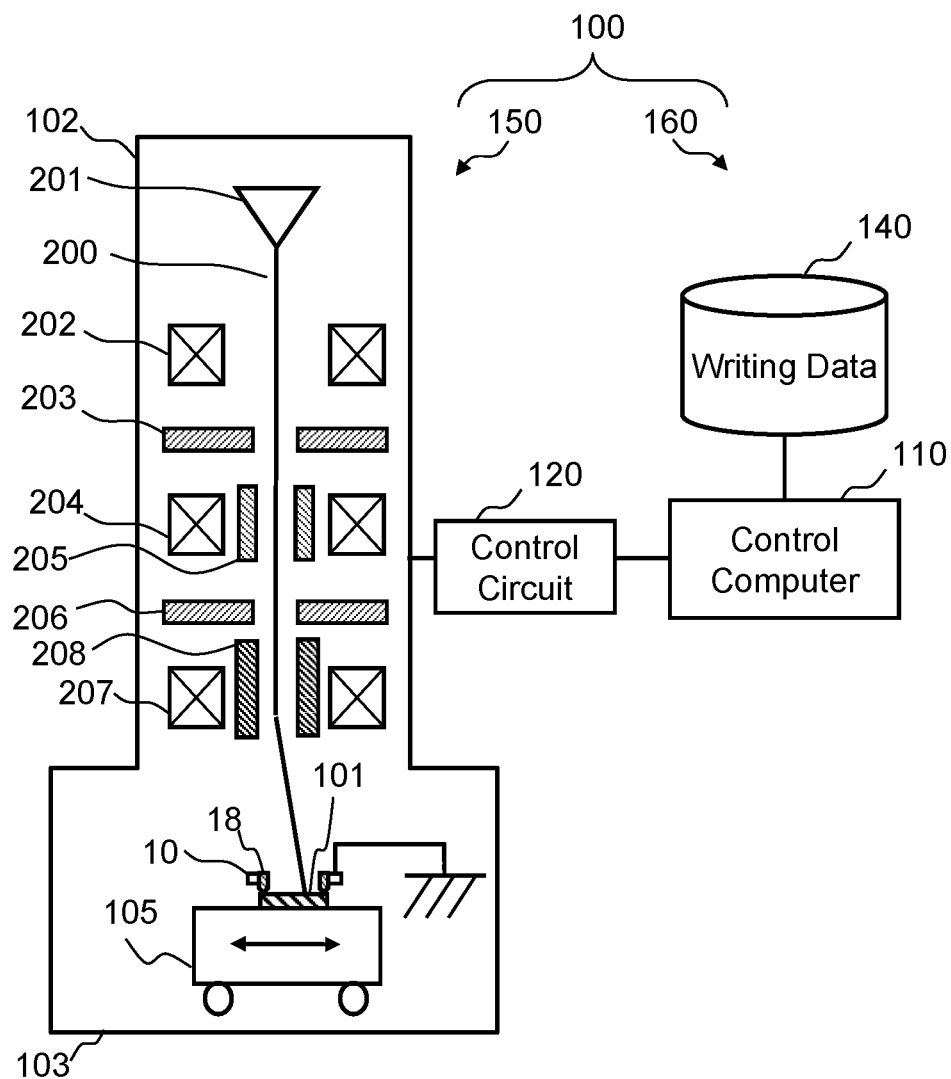
FIG. 14 is a schematic diagram showing a configuration of a writing apparatus according to the first embodiment.

FIG. 14 is a schematic diagram showing a configuration of a writing apparatus according to the first embodiment. In FIG. 14, a writing apparatus 100 includes a writing mechanism 150 and a control circuit 160. The writing apparatus 100 is an example of a charged particle beam writing apparatus, and particularly, an example of a variable shaped beam (VSB) writing apparatus. The writing mechanism 150 includes an electron optical column 102 and a writing chamber 103. In the electron optical column 102, there are arranged an electron gun 201, an illumination lens 202, a first shaping aperture plate 203, a projection lens 204, a deflector 205, a second shaping aperture plate 206, an objective lens 207, and a deflector 208. In the writing chamber 103, there is arranged an XY stage 105 which is movable at least in the x-y direction. On the XY stage 105, there is placed a substrate 101 on which resist has been applied. Here, the above-described exposure mask substrate 300 (mask blank before written) is placed, for example. In the exposure mask substrate 300 (mask blank before written), a light shielding film (conductive film 304), such as chromium (Cr), the insulating film 306, such as chromic oxide, and the resist film 308 are laminated in order on the glass substrate 302. As the substrate 101, it is also preferable to arrange, instead of the exposure mask substrate 300 (mask blank before written), a semiconductor substrate used for manufacturing semiconductor devices, such as a silicon wafer. Also in this semiconductor substrate, the conductive film 304, the dense insulating film 306, and the resist film 308 are laminated in order. The substrate 101 covered with a substrate cover 10 is placed on the XY stage 105. The substrate 101 is electrically connected to the ground of the writing apparatus 100 through the substrate cover 10, and maintained at a ground potential.

The control circuit 160 includes a control computer unit 110, a control circuit 120, and a storage device 140, such as a magnetic disk drive. The control computer unit 110, the control circuit 120, and the storage device 140 are connected with each other through a bus (not shown). The control circuit 120 is connected to the writing mechanism 150, and drives/controls each configuration of the writing mechanism 150.

FIG. 14 shows structure elements necessary for describing the first embodiment. It should be understood that other structure elements generally necessary for the writing apparatus 100 may also be included therein. The writing mechanism 150 (irradiation mechanism) irradiates the substrate 101 with an electron beam, in the state where a film to be broken of the substrate 101 has been broken by pressure on the film by the conductive contact point pin 18 so as to be electrically connected to a conductive film, and a ground potential has been applied to the conductive contact point pin 18. Here, the writing mechanism 150 writes a pattern on the substrate 101 by using an electron beam. Operations of the writing mechanism 150 will be specifically described.

An electron beam 200 emitted from the electron gun 201 (emission source) irradiates the whole of the first shaping aperture plate 203 which has a quadrangular opening by the illumination lens 202. At this stage, the electron beam 200 is first shaped to a quadrangle. Then, after passing through the first shaping aperture plate 203, the electron beam 200 of a first aperture image is projected onto the second shaping aperture plate 206 by the projection lens 204. The first aperture image on the second shaping aperture plate 206 is deflection-controlled by the deflector 205 so as to change (variably shape) the shape and size of the beam. Such variable beam shaping is performed for each shot, and each shot is generally shaped to have a different shape and size. Then, after passing through the second shaping aperture plate 206, the electron beam 200 of a second aperture image is focused by the objective lens 207, and deflected by the deflector 208 so as to reach a desired position on the substrate 101 placed on the XY stage 105 which moves continuously.

Figure 15:
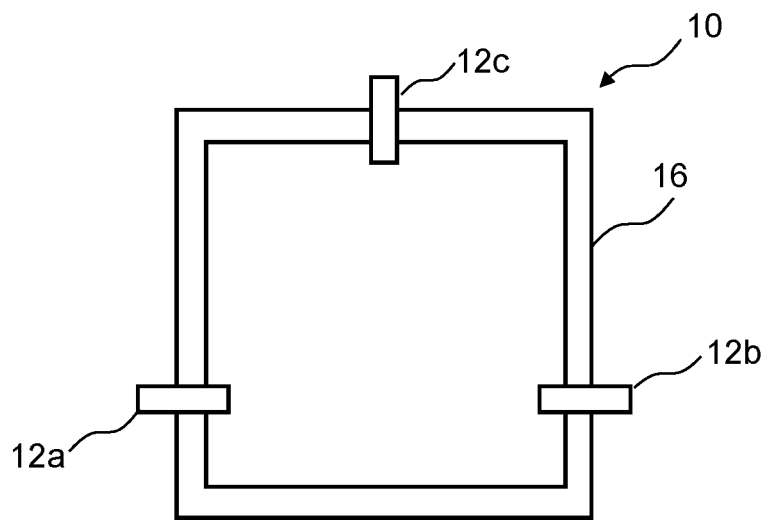
FIG. 15 shows a top view of a substrate cover according to the first embodiment.
Figure 16:
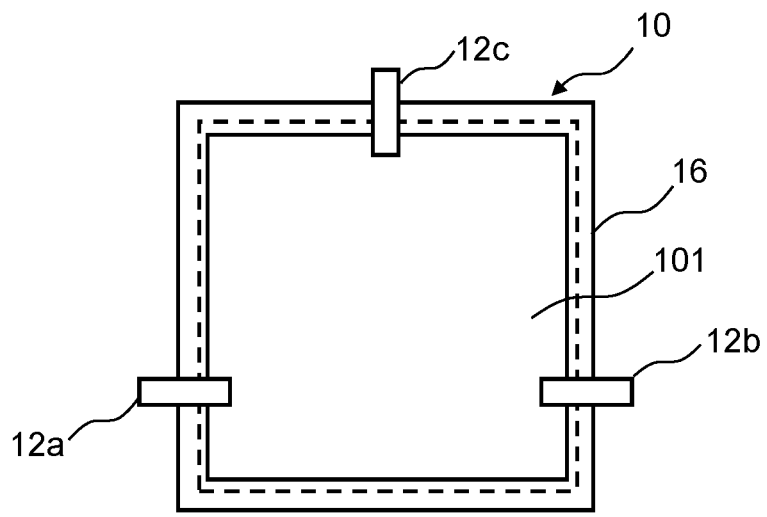
FIG. 16 shows a top view of a substrate covered with the substrate cover of FIG. 15.
Figure 17:
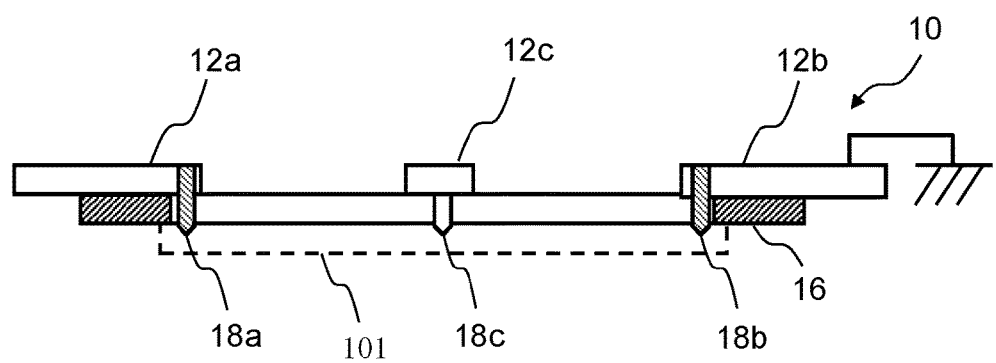
FIG. 17 shows a sectional view of the substrate cover of FIG. 15.

FIG. 15 shows a top view of a substrate cover according to the first embodiment. FIG. 16 shows a top view of a substrate covered with the substrate cover of FIG. 15. FIG. 17 shows a sectional view of the substrate cover of FIG. 15. The substrate cover 10 includes three contact support members 12 (12a, 12b, and 12c) and a frame 16 (an example of a frame-like member). The contact support members 12 (12a, 12b, and 12c) are fixed from above the frame 16 to the positions supporting the substrate cover 10 by three-point support. The contact support members 12 (12a, 12b, and 12c) are fixed such that their ends protrude more inward than the inner peripheral end of the frame 16. Not only protruding inward, it is also acceptable that the other end protrudes more outward than the outer peripheral end of the frame 16. The contact support members 12 are fixed to the frame 16 by screw clamping or welding, for example. At the backside of each of the contact support members 12 (12a, 12b, and 12c), the conductive contact point pin 18 (here, earth pin) serving as a contact portion is arranged, with its tip in the same direction as the heading direction of the backside of the contact support member 12, at the position more inward than the inner peripheral end of the frame 16.

The frame 16 is configured by a plate, and formed such that its peripheral dimension is larger than the outer peripheral end of the substrate 101, and the dimension of the opening, which is at the central part of the inner side, is smaller than the outer peripheral end of the substrate 101. That is, as shown in FIG. 16, it is structured such that when the substrate cover 10 is placed on the upper side of the substrate 101 from above, the whole circumference of the outer peripheral part of the substrate 101 shown in a dotted line overlaps with the frame 16. Thus, the substrate cover 10 covers the whole periphery of the substrate 101 from above. When the substrate 101 is covered with the substrate cover 10, the three conductive contact point pins 18 cut into the film formed on the substrate 101, and electrically connect to the conductive film also formed on the substrate 101.

It is preferable for the substrate cover 10 to be entirely formed of conductive material, or entirely formed of insulating material except for its surface coated with conductive material. It is preferable for the conductive material to be a metal, such as copper (Cu), titanium (Ti), or its alloy, etc. It is preferable for the insulating material to be ceramic, such as alumina, etc.

By applying the substrate cover 10 on the substrate 101, the three conductive contact point pins 18 break the insulating film which is hard to break due to its fine density, and electrically connect to an underlying conductive film. The conductive contact point pin 18 is connected to a ground potential through the substrate cover 10. With this configuration, charging caused by that the electron beam 200 collides with or scatters from the surface of the substrate 101 can be inhibited. Consequently, it is possible to inhibit the trajectory of the electron beam 200 from being bent, thereby writing patterns of highly accurate dimension.

As described above, according to the first embodiment, it is possible to break a dense film to be broken, so that electrical connection to an underlying film can be achieved. Therefore, it is possible to inhibit charging (electrification) of other film(s) formed on the conductive film 304.

Second Embodiment

Although in the first embodiment the end of the tapered tip of the pin body 13 is shaped to be spherical, for example, it is not limited thereto. The contents of the present embodiment are the same as those of the first embodiment except for what is specifically described below.

Figure 18:
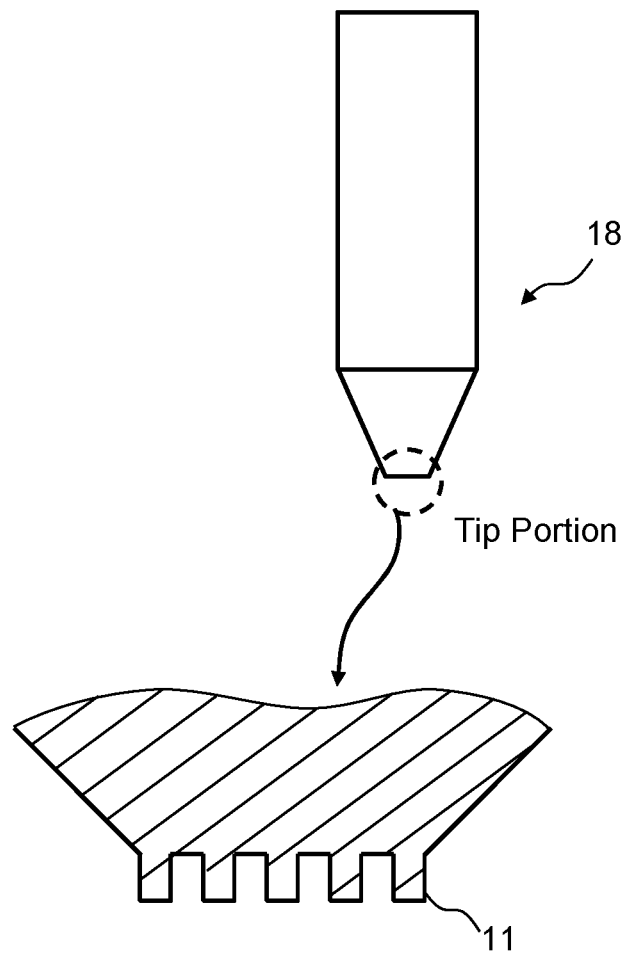
FIG. 18 shows a structure of a conductive contact point pin according to a second embodiment.

FIG. 18 shows a structure of a conductive contact point pin according to a second embodiment. In FIG. 18, the end of the tapered tip of the pin body 13 of the conductive contact point pin 18 may be a flat surface. Then, it is also preferable that the flat surface is engraved/carved from the tip side to form a plurality of convex portions 11 (in other words, a plurality of concave portions each formed between the convex portions 11) in the shape of a quadrangular prism, for example. Other respects are the same as those of FIG. 1. Also with this configuration, it is possible to break a dense film to be broken so as to be electrically connected to the underlying film. A plurality of convex portions 11 of FIG. 18 may be formed on the entire surface at the tip side, or in a part of the surface. According to the second embodiment, the same effect as that of the first embodiment can be acquired.

Embodiments have been explained referring to specific examples described above. However, the present invention is not limited to these specific examples. The substrate to which the conductive contact point pin 18 is inserted is not limited to the exposure mask substrate 300. For example, the conductive contact point pin 18 may be inserted into a semiconductor substrate when pattern writing is performed by directly irradiating the semiconductor substrate with an electron beam. Moreover, the conductive contact point pin 18 can be applied not only in the case of a ground connection but also in the case of measuring a resistance value of a conductive layer lying under an insulating film of the semiconductor substrate, for example.

While the apparatus configuration, control method, and the like not directly necessary for explaining the present invention are not described, some or all of them can be selectively used on a case-by-case basis when needed. For example, although description of the configuration of the control circuit for controlling the writing apparatus 100 is omitted, it should be understood that some or all of the configuration of the control circuit can be selected and used appropriately when necessary.

Moreover, any other conductive contact point pin that includes elements of the present invention and that can be appropriately modified by those skilled in the art is included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A conductive contact point pin comprising:
   a pin body; and
   a plurality of convex portions formed in a tip portion of the pin body, wherein
   the plurality of convex portions are configured to break a film formed on a conductive film so as to electrically connect the pin body with the conductive film by being pressed on a substrate where the film to be broken is formed on the conductive film from above the film to be broken,
   the film to be broken includes chromic oxide ($CrO_2$),
   an interspace between adjacent convex portions of the plurality of convex portions is formed to be equal to or greater than 1.3 µm,
   a height dimension of the plurality of convex portions is larger than a film thickness of the film to be broken,
   the number of the plurality of convex portions is twenty-five or more,
   a tip top surface of each of the plurality of convex portions is a square, sides of which have a length in range of 0.2 µm to 0.5 µm, and
   the plurality of convex portions are chamfered so that the sides of the tip top surface of each of the plurality of convex portions has a radial dimension smaller than 0.05 µm.

2. The conductive contact point pin according to claim 1, wherein one of a chromium (Cr) film and a tungsten (W) film is used as the conductive film.

3. The conductive contact point pin according to claim 1, wherein one of a semiconductor substrate and an exposure mask substrate is used as the substrate.

4. The conductive contact point pin according to claim 1, wherein each of the plurality of convex portions includes sides forming a tip top surface.

5. The conductive contact point pin according to claim 4, wherein a shape of the each of the plurality of the convex portions is one of a cylindrical shape, triangular prismatic shape, quadrangular prismatic shape, pentagonal prismatic shape, hexagonal prismatic shape, and other polygonal prismatic shape.

6. The conductive contact point pin according to claim 1, wherein an interspace between adjacent convex portions of the plurality of convex portions is greater than a width dimension of each of the plurality of the convex portions.

7. A charged particle beam apparatus comprising:
   a stage configured to mount thereon a substrate where a film to be broken is formed on a conductive film;
   a conductive contact point pin including a pin body and a plurality of convex portions formed in a tip portion of the pin body, the plurality of convex portions configured to break the film to be broken so as to electrically connect the pin body with the conductive film by being pressed on the substrate from above the film to be broken; and
   an irradiation mechanism configured to irradiate the substrate with a charged particle beam, in a state where a ground potential is applied to the conductive film via the conductive contact point pin,
   wherein the film to be broken includes chromic oxide ($CrO_2$),
   an interspace between adjacent convex portions of the plurality of convex portions is formed to be equal to or greater than 1.3 µm,
   a height dimension of the plurality of convex portions is larger than a film thickness of the film to be broken,
   the number of the plurality of convex portions is twenty-five or more,
   a tip top surface of each of the plurality of convex portions is a square, sides of which have a length in range of 0.2 µm to 0.5 µm, and
   the plurality of convex portions are chamfered so that the sides of the tip top surface of each of the plurality of convex portions has a radial dimension smaller than 0.05 µm.

8. The apparatus according to claim 7, further comprising:
   a substrate cover where the conductive contact point pin is arranged,
   wherein the substrate, covered with the substrate cover, is irradiated with the charged particle beam.

9. The apparatus according to claim 7, wherein one of a chromium (Cr) film and a tungsten (W) film is used as the conductive film.

10. The apparatus according to claim 7, wherein one of a semiconductor substrate and an exposure mask substrate is used as the substrate.

11. The apparatus according to claim 7, wherein each of the plurality of convex portions includes sides forming a tip top surface.

12. The apparatus according to claim 11, wherein a shape of the each of the plurality of the convex portions is one of a cylindrical shape, triangular prismatic shape, quadrangular prismatic shape, pentagonal prismatic shape, hexagonal prismatic shape, and other polygonal prismatic shape.

13. The apparatus according to claim 7, wherein an interspace between adjacent convex portions of the plurality of convex portions is greater than a width dimension of each of the plurality of the convex portions.

14. The conductive contact point pin according to claim 1, wherein the plurality of convex portions are arranged in a shape of a weaving lattice at the tip portion of the pin body.

15. The conductive contact point pin according to claim 14, wherein the tip portion of the pin body has a round surface formed by the tip top surfaces of the plurality of convex portions.

16. The conductive contact point pin according to claim 7, wherein the plurality of convex portions are arranged in a weaving lattice form at the tip portion of the pin body.

17. The conductive contact point pin according to claim 16, wherein the tip portion of the pin body has a round surface formed by the tip top surfaces of the plurality of convex portions.

\* \* \* \* \*